US010164668B2

(12) United States Patent
Zhou et al.

(10) Patent No.: US 10,164,668 B2
(45) Date of Patent: Dec. 25, 2018

(54) MOBILE DEVICE, RADIO TRANSCEIVER CIRCUIT, AND IMPEDANCE ADJUSTMENT DEVICE

(71) Applicant: Intel Corporation, Santa Clara, CA (US)

(72) Inventors: Jinfeng Zhou, Hangzhou (CN); Zhichong Chen, Hangzhou (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/184,096

(22) Filed: Jun. 16, 2016

(65) Prior Publication Data

US 2017/0019134 A1 Jan. 19, 2017
US 2018/0102798 A9 Apr. 12, 2018

(30) Foreign Application Priority Data

Jul. 17, 2015 (CN) .......................... 2015 1 0424768

(51) Int. Cl.
*H04B 1/04* (2006.01)
*H04M 1/24* (2006.01)
(Continued)

(52) U.S. Cl.
CPC ....... *H04B 1/0475* (2013.01); *G06F 13/4282* (2013.01); *H03F 3/195* (2013.01);
(Continued)

(58) Field of Classification Search
CPC ......... H03F 2200/423; H03F 2200/387; H03F 2203/21139; H03F 3/195; H03F 3/24;
(Continued)

(56) References Cited

U.S. PATENT DOCUMENTS 8,351,874 B2 * 1/2013 Dent .................... H04B 1/0458
330/129
8,750,810 B2 * 6/2014 Pletcher ................... H03F 1/56
330/144

(Continued)

FOREIGN PATENT DOCUMENTS

CN 101005289 A 7/2007
CN 103312278 A 9/2013
(Continued)

OTHER PUBLICATIONS

Office Action dated Nov. 28, 2016 for Chinese Patent Application No. 201510424768.6.

*Primary Examiner* — Sophia Vlahos
(74) *Attorney, Agent, or Firm* — Schiff Hardin LLP

(57) ABSTRACT

A mobile phone device, a radio frequency transceiver circuit and an impedance adjusting device. The present invention discloses a mobile phone device. The mobile phone device comprises a baseband processor, an antenna, a duplexer and a radio frequency transceiver circuit. The antenna is used to receive and send radio frequency signals. The duplexer is electrically connected to the antenna. The radio frequency transceiver circuit is connected to the baseband processor and the duplexer, respectively. The radio frequency transceiver circuit comprises a first power amplifier and an impedance adjusting device. The first power amplifier has a first output impedance. The impedance adjusting device is electrically connected between the first power amplifier and the duplexer, and comprises at least one switch, wherein the baseband processor is connected to and control the at least one switch of the impedance adjusting device to adjust an impedance value of the impedance adjusting device, such that a first load impedance of the first power amplifier and the first output impedance match one another.

10 Claims, 5 Drawing Sheets

(51) Int. Cl.
*G06F 13/42* (2006.01)
*H03F 3/195* (2006.01)
*H03F 3/24* (2006.01)
*H04L 5/14* (2006.01)
*H04M 1/725* (2006.01)

(52) U.S. Cl.
CPC ............. *H03F 3/24* (2013.01); *H03F 3/245* (2013.01); *H04B 1/0458* (2013.01); *H04L 5/14* (2013.01); *H04M 1/24* (2013.01); *H03F 2200/294* (2013.01); *H03F 2200/423* (2013.01); *H03F 2200/451* (2013.01); *H04B 2001/0408* (2013.01); *H04M 1/72527* (2013.01)

(58) Field of Classification Search
CPC ............. H03F 3/245; H03F 2200/294; H03F 2200/451; H03H 7/40; H04B 1/0458; H04B 1/0475; H04B 2001/0408; G06F 13/4282; H04L 5/14; H04M 1/24; H04M 1/2527
See application file for complete search history.

(56) References Cited

U.S. PATENT DOCUMENTS

| | | | |
|---|---|---|---|
| 2005/0030094 A1* | 2/2005 | Conrad | H03F 1/02 330/144 |
| 2007/0001756 A1* | 1/2007 | Trocke | H03F 1/0261 330/2 |
| 2007/0135062 A1 | 6/2007 | Hwang et al. | |
| 2007/0197180 A1* | 8/2007 | McKinzie, III | H03H 7/40 455/248.1 |
| 2010/0291888 A1* | 11/2010 | Hadjichristos | H03F 1/0277 455/127.4 |
| 2010/0321086 A1* | 12/2010 | See | H04B 1/0458 327/359 |
| 2011/0032035 A1* | 2/2011 | Pletcher | H03F 1/0277 330/277 |
| 2011/0043285 A1* | 2/2011 | Zhao | H03F 1/42 330/277 |
| 2012/0056677 A1* | 3/2012 | Zhu | H03F 1/0233 330/296 |
| 2014/0010317 A1* | 1/2014 | Oshikiri | H04L 7/0012 375/259 |
| 2014/0055199 A1* | 2/2014 | Takano | H03F 1/56 330/145 |
| 2014/0378188 A1* | 12/2014 | Liu | H04W 52/0261 455/574 |
| 2015/0137889 A1* | 5/2015 | Olson | H03F 3/211 330/295 |
| 2015/0270813 A1* | 9/2015 | Morshedi | H04B 17/19 455/144 |
| 2016/0109921 A1* | 4/2016 | Chen | G06F 1/10 713/322 |

FOREIGN PATENT DOCUMENTS

| | | |
|---|---|---|
| CN | 103428829 A | 12/2013 |
| CN | 103546188 A | 1/2014 |
| WO | WO-2013/063938 A1 | 5/2013 |

* cited by examiner

MOBILE DEVICE, RADIO TRANSCEIVER CIRCUIT, AND IMPEDANCE ADJUSTMENT DEVICE

TECHNICAL FIELD

The present invention relates to an impedance adjusting device, and particularly relates to an impedance adjusting device applied in matching different power amplifiers.

BACKGROUND

In a common mobile communication device, matching impedance networks of a power amplifier, such as a broadband pulse amplitude modulation power amplifier, in a radio frequency circuit are all paired in a customized manner. Once there is a need for a replacement with a different power amplifier, the customized matching impedance network also needs to be replaced accordingly, which increases the production cost. In view of this, the present invention proposes an impedance adjusting device and a mobile phone device applying the impedance adjusting device.

SUMMARY

An embodiment of the present invention provides a mobile phone device. The mobile phone device comprises a baseband processor, an antenna, a duplexer and a radio frequency transceiver circuit. The antenna is used to receive and send a plurality of radio frequency signals. The duplexer is electrically connected to the antenna. The radio frequency transceiver circuit is connected to the baseband processor and the duplexer, respectively. The radio frequency transceiver circuit comprises a first power amplifier and an impedance adjusting device. The first power amplifier has a first output impedance. The impedance adjusting device is electrically connected between the first power amplifier and the duplexer, and comprises at least one switch, wherein the baseband processor is connected to and control the at least one switch of the impedance adjusting device to adjust an impedance value of the impedance adjusting device, such that a first load impedance of the first power amplifier and the first output impedance match one another.

An embodiment of the present invention provides a radio frequency transceiver circuit. The radio frequency transceiver circuit comprises a first power amplifier and an impedance adjusting device. The first power amplifier has a first output impedance. The impedance adjusting device is electrically connected to the first power amplifier, and comprises at least one switch, wherein the impedance adjusting device controls the at least one switch according to a first control signal received from a baseband processor to adjust an impedance value of the impedance adjusting device, such that a first load impedance of the first power amplifier and the first output impedance match one another.

An embodiment of the present invention provides an impedance adjusting device applicable to matching a first power amplifier or a second power amplifier. The impedance adjusting device comprises a first switch and a second switch. The first switch and the second switch are used to switch an impedance value of the impedance adjusting device to a first impedance value or a second impedance value, wherein the impedance adjusting device switches the impedance value to the first impedance value according to a first control signal received from a baseband processor to adjust a first load impedance of the first power amplifier, such that the first load impedance and a first output impedance of the first power amplifier match one another.

DETAILED DESCRIPTION OF THE INVENTION

Embodiments or examples of the accompanying drawings of the disclosure will be described as follows. The scope of the disclosure is not limited thereto. It will be appreciated by those skilled in the art that some modification, replacement and substitution can be made without departing from the spirit and architecture of the disclosure. In embodiments of the disclosure, element symbols may be used repeatedly, and several embodiments of the disclosure may share the same element symbols. However, a feature element used by one embodiment is not necessarily used by another embodiment.

Figure 1A:
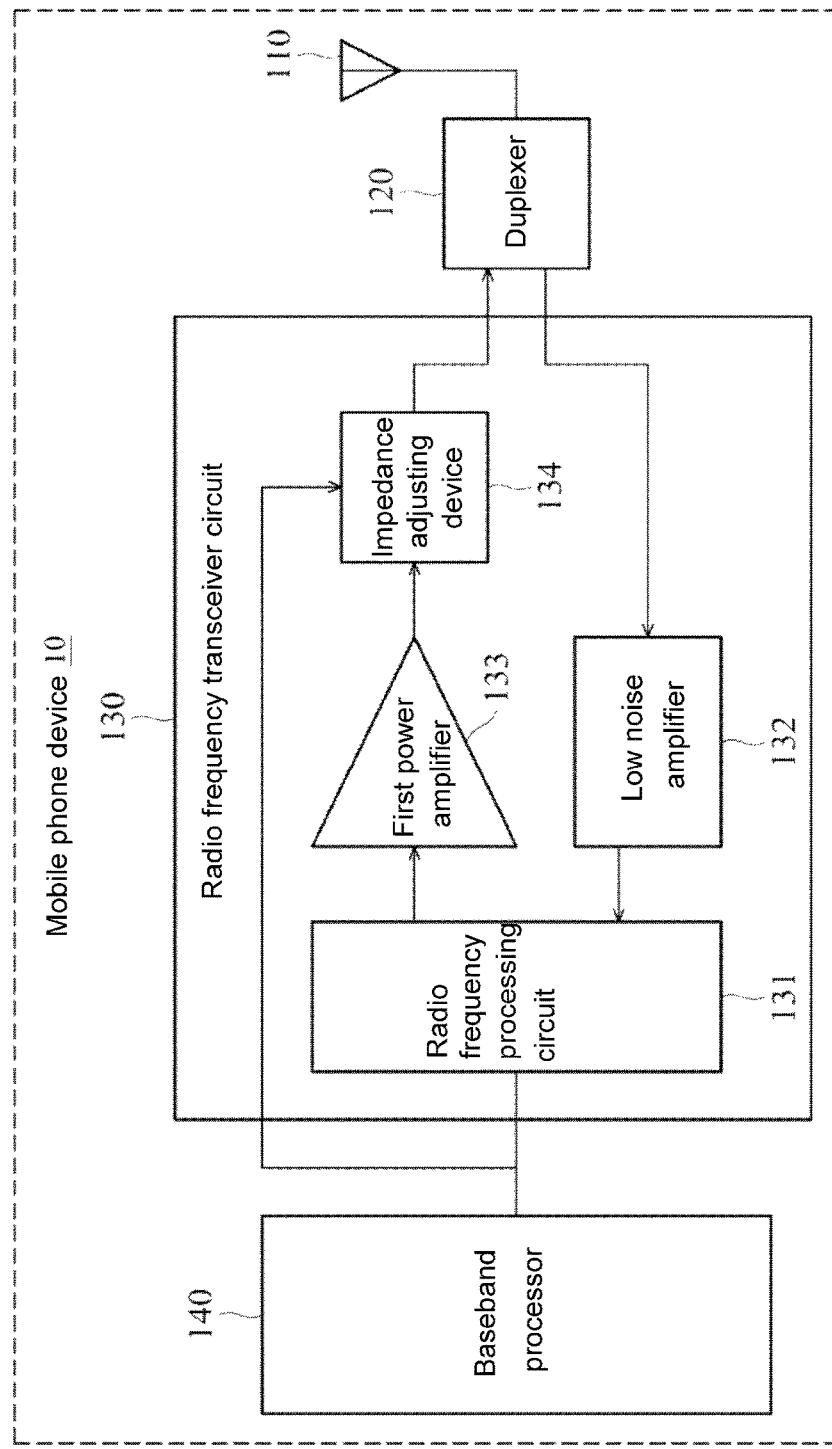
FIGS. 1A and 1B are block diagrams illustrating a mobile phone device 10 of the present invention by way of example in accordance with a first embodiment of the present invention.
Figure 1B:
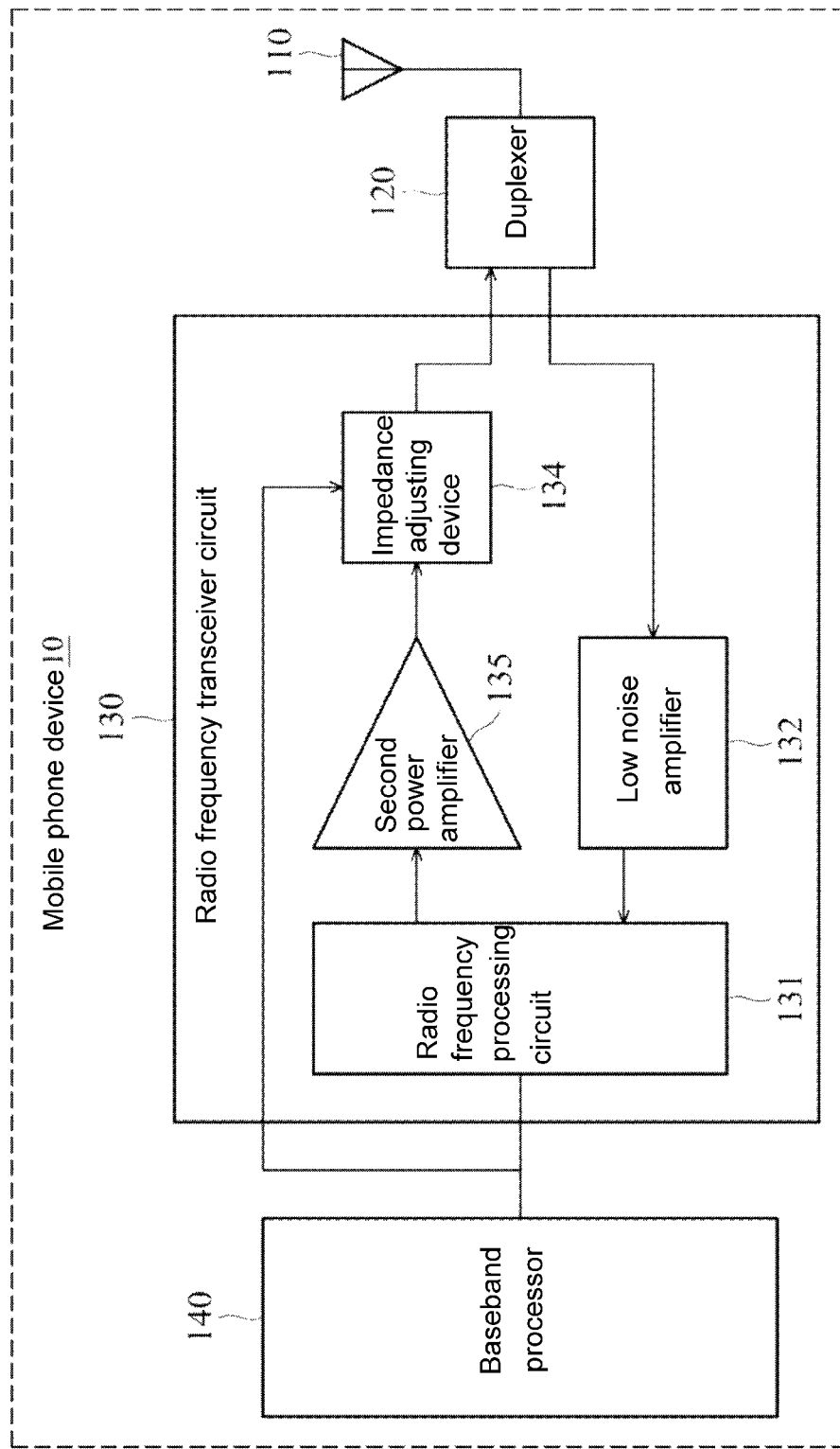

FIGS. 1A and 1B are block diagrams illustrating a mobile phone device 10 of the present invention by way of example in accordance with a first embodiment of the present invention. In the first embodiment of the present invention, as shown in FIG. 1A, the mobile phone device 10 comprises an antenna 110, a duplexer 120, a radio frequency transceiver circuit 130 and a baseband processor 140. The antenna 110 is used to receive and send a plurality of radio frequency signals. The duplexer 120 is electrically connected to the antenna 110 and the radio frequency transceiver circuit 130, respectively. The radio frequency transceiver circuit 130 is electrically connected to the baseband processor 140. In the first embodiment of the present invention, the radio frequency transceiver circuit 130 includes a radio frequency processing circuit 131, a low noise amplifier 132, a first power amplifier 133 and an impedance adjusting device 134. The low noise amplifier 132 is used to filter out noises in a radio frequency signal received by the antenna 110. The first power amplifier 133 is used to amplify the power of the radio frequency signal and then output it to the antenna, and has a first output impedance. The impedance adjusting device 134 is electrically connected between the first power amplifier 133 and the duplexer 120. The impedance adjusting device 134 is an array composed of an variable capacitor, an inductor and at least one switch, and has an adjustable impedance value. In the first embodiment of the present invention, the radio frequency processing circuit 131 includes relevant analogue circuits such as a frequency mixer circuit, an oscillator circuit, an IQ modulator circuit, a phase-locked loop, a frequency demultiplier circuit, an IQ demodulator circuit, and the like.

In the first embodiment of the present invention, the baseband processor 140 is connected to the impedance adjusting device 134, and controls the at least one switch of the impedance adjusting device 134 to adjust an impedance value of the impedance adjusting device 134. In the first embodiment of the present invention, a first load impedance of the first power amplifier 133 is an equivalent impedance of the impedance adjusting device 134 plus an equivalent impedance of a next-stage duplexer 120. Therefore, the baseband processor 140 controls the at least one switch of the impedance adjusting device 134 via a Mobile Industry Processor Interface (MIPI) of the baseband processor to adjust the impedance value of the impedance adjusting device 134, for example, sending a first control signal to the impedance adjusting device 134, such that a first load impedance of the first power amplifier 133 and the first output impedance match one another. At this point, the first output impedance may equal a conjugate impedance of the first load impedance, such that the energy transmitted from the first power amplifier 133 to the first load impedance is maximal. Furthermore, in the first embodiment of the present invention, a designer can calculate in advance, according to a Smith chart, the impedance value of the impedance adjusting device 134 required to match the first output impedance.

In the first embodiment of the present invention, as shown in FIG. 1B, when a designer of the mobile phone device 10 replaces the first power amplifier 133 in the mobile phone device 10 with a second power amplifier 135 based on design considerations, for example, replaces with a power amplifier with another frequency band based on the frequency band consideration, the designer of the mobile phone device 10 sets the baseband processor 140 such that the baseband processor 140 sends a second control signal to the impedance adjusting device 134. At this point, the impedance adjusting device 134 adjusts the impedance value of the impedance adjusting device 134 according to the second control signal such that a second load impedance of the second power amplifier 135 and a second output impedance of the second power amplifier 135 match one another. In the first embodiment of the present invention, a second load impedance of the second power amplifier 135 is an equivalent impedance of the impedance adjusting device 134 plus an equivalent impedance of a next-stage duplexer 120. At this point, the second output impedance may equal a conjugate impedance of the second load impedance such that the energy transmitted from the second power amplifier 135 to the second load impedance is maximal. Furthermore, in the first embodiment of the present invention, a designer can calculate in advance, according to a Smith chart, the impedance value of the impedance adjusting device 134 required to match the second output impedance.

Figure 2A:
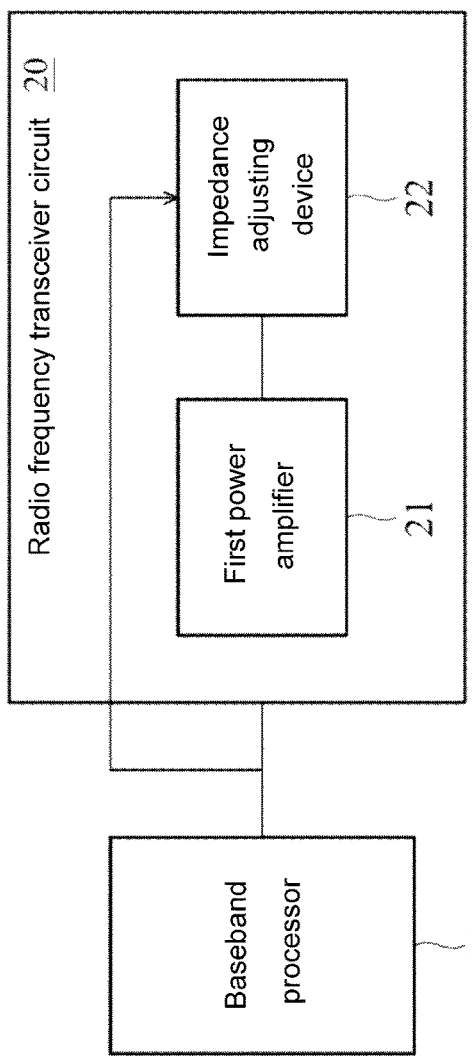
FIGS. 2A and 2B are block diagrams illustrating a radio frequency transceiver circuit 20 of the present invention by way of example in accordance with a second embodiment of the present invention.
Figure 2B:
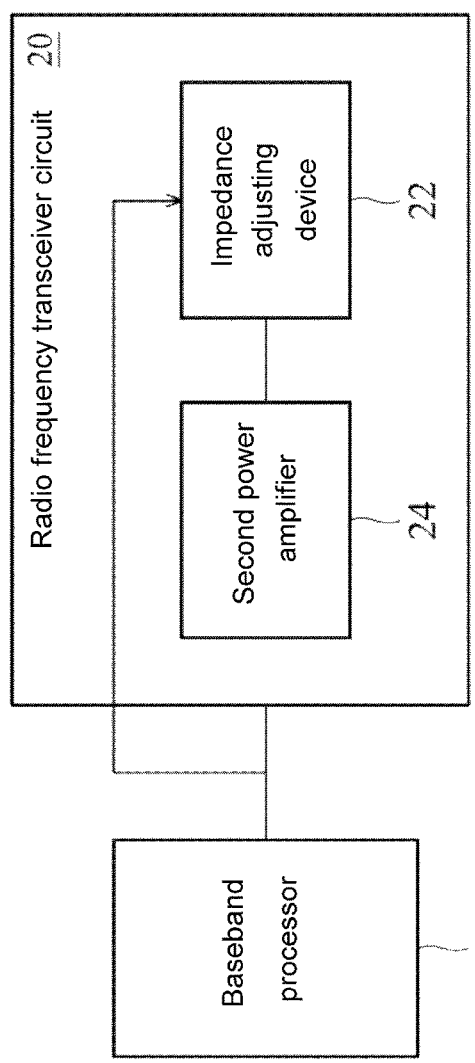

FIGS. 2A and 2B are block diagrams illustrating a radio frequency transceiver circuit 20 of the present invention by way of example in accordance with a second embodiment of the present invention. In the second embodiment of the present invention, as shown in FIG. 2A, the radio frequency transceiver circuit 20 comprises a first power amplifier 21 and an impedance adjusting device 22. The first power amplifier 21 has a first output impedance, and is electrically connected to an impedance adjusting device 22. The impedance adjusting device 22 is an array composed of an variable capacitor, an inductor and at least one switch, and has an adjustable impedance value. In the second embodiment of the present invention, the impedance adjusting device 22 controls the at least one switch of the impedance adjusting device 22 according to a first control signal received from a baseband processor 23 to adjust an impedance value of the impedance adjusting device, such that a first load impedance of the first power amplifier 21 and the first output impedance match one another. At this point, the first output impedance may equal a conjugate impedance of the first load impedance such that the energy transmitted from the first power amplifier 21 to the first load impedance is maximal.

In the second embodiment of the present invention, as shown in FIG. 2B, when the first power amplifier 21 in the radio frequency transceiver circuit 20 is replaced with a second power amplifier 24, the impedance adjusting device 22 controls the at least one switch according to a second control signal received from a baseband processor 23 to adjust the impedance value of the impedance adjusting device, such that a second load impedance of the second power amplifier 24 and a second output impedance of the second power amplifier 24 match one another. At this point, the second output impedance may equal a conjugate impedance of the second load impedance such that the energy transmitted from the second power amplifier 24 to the second load impedance is maximal.

Figure 3A:
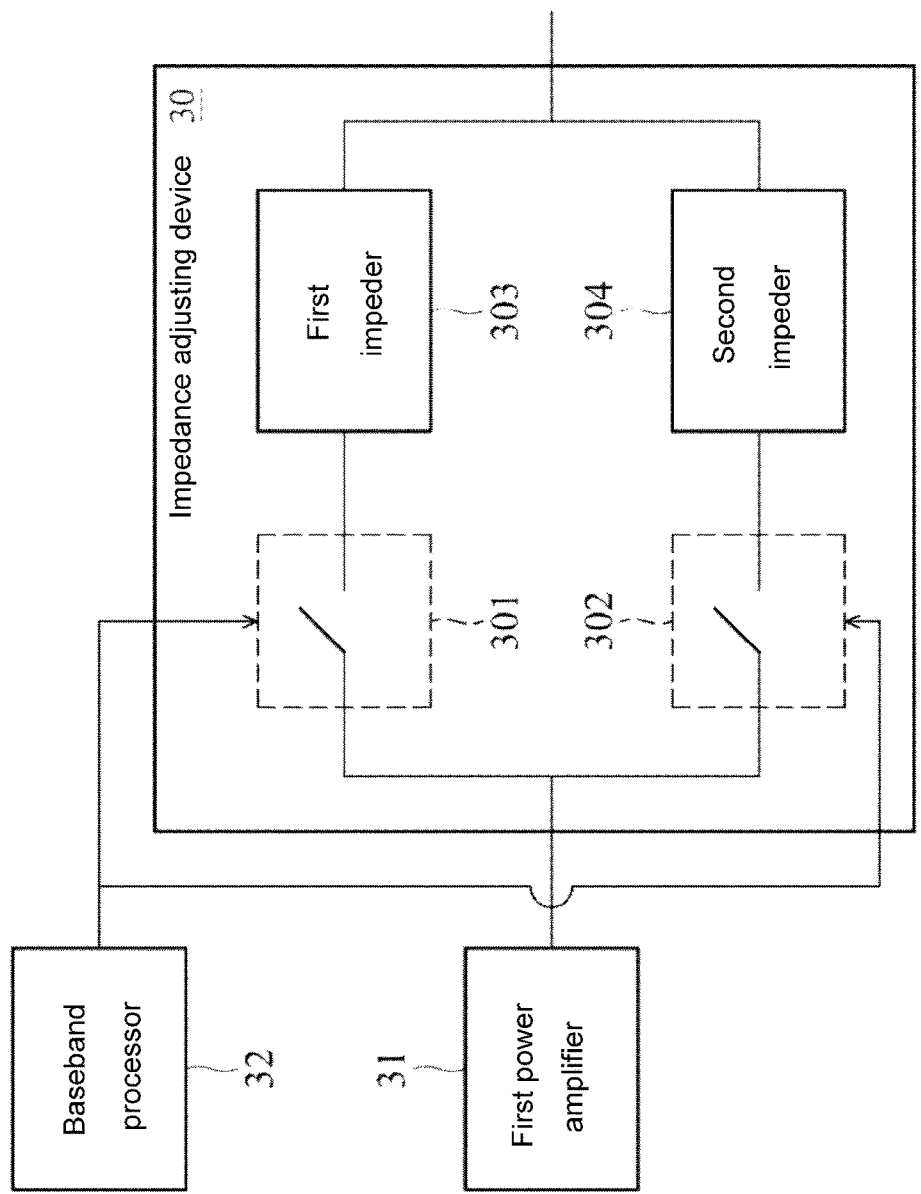
FIGS. 3A and 3B are block diagrams illustrating an impedance adjusting device 30 of the present invention by way of example in accordance with a third embodiment of the present invention.
Figure 3B:
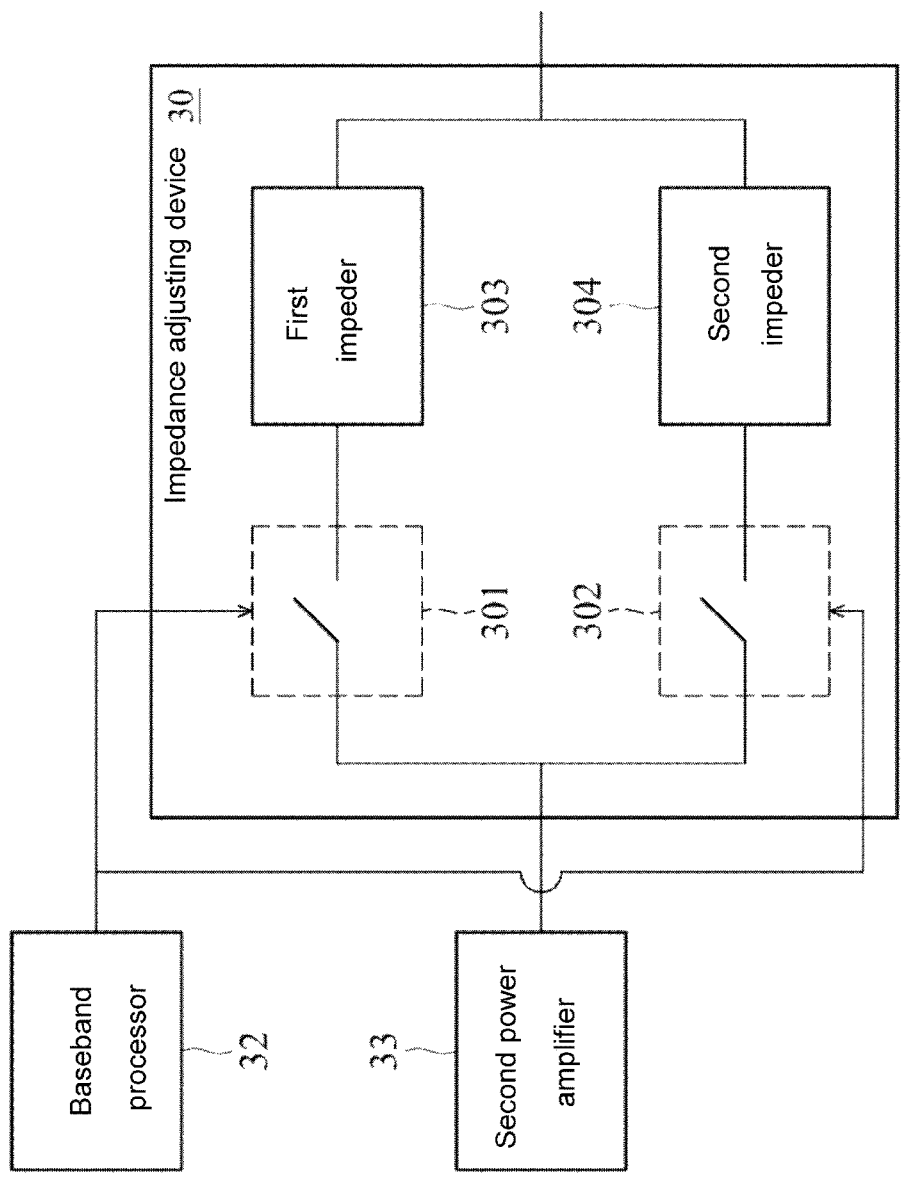

FIGS. 3A and 3B are block diagrams illustrating an impedance adjusting device 30 of the present invention by way of example in accordance with a third embodiment of the present invention. In the third embodiment of the present invention, as shown in FIG. 3A, the impedance adjusting device 30 comprises a first switch 301, a second switch 302, a first impeder 303 and a second impeder 304. As shown in FIG. 3A, the first switch 301 and the second switch 302 are electrically connected to the first impeder 303 and the second impeder 304, respectively. The impedance adjusting device 30 provides the first impeder 303 or the second impeder 304 as the load impeder of a first power amplifier 31 by switching the first switch 301 and the second switch 302. In the third embodiment of the present invention, the impedance adjusting device 30 turns on the first switch 301 and turns off the second switch 302 according to a first control signal received from a baseband processor 32 to provide the first impeder 303, such that the impedance of the first impeder 303 and a first output impedance of the first power amplifier 31 match one another. Furthermore, in the third embodiment of the present invention, a designer can calculate in advance, according to a Smith chart, the impedance value of the first impeder 303 required to match the first output impedance.

In the third embodiment of the present invention, as shown in FIG. 3B, when the impedance adjusting device 30 is changed to match a second output impedance of a second power amplifier 33, the impedance adjusting device 30 turns on the second switch 302 and turns off the first switch 301 according to a second control signal received from a baseband processor 32 to provide the second impeder 304, such that the impedance of the second impeder 304 and a second output impedance of the second power amplifier 33 match one another. Furthermore, in the third embodiment of the present invention, a designer can calculate in advance, according to a Smith chart, the impedance value of the second impedance 304 required to match the second output impedance.

The impedance adjusting device as described in the first to third embodiments of the present invention can be applied in a common radio frequency transmitter circuit, and can be used as a load impeder of which the impedance matches the impedance of each power amplifier in the radio frequency transmitter circuit. For example, power amplifiers applied at different bandwidths are generally used in wireless mobile devices of LTE or CDMA. When a designer wants to replace some of the power amplifiers, the matching impeder networks paired with the power amplifiers also need to be replaced accordingly. At this point, if the impedance adjusting device of the present invention is respectively carried at a load end of each power amplifier, the designer only needs to send a control signal via a baseband processor to the impedance adjusting device so as to adjust the impedance value of the impedance adjusting device, without replacing the matching impeder network paired with the power amplifier. Therefore, the application of the impedance adjusting device of the present invention enables a designer of a radio frequency device not need to replace an impedance matching network corresponding to the power amplifier in plan of replacing with a different power amplifier, thus effectively saving a cost of development. In addition, the impedance adjusting device as described in the first to third embodiments of the present invention can design according to users' need a plurality of different groups of matching impedances, the number of which can change with the users' needs.

Although the present invention is disclosed above with preferred embodiments to enable those skilled in the art to understand the contents of the present invention more clearly, it will be understood by those skilled in the art that the can, on the basis of the present invention, easily design or modify the flow and use a mobile phone device, a radio frequency transceiver circuit and an impedance adjusting device to achieve the same purpose and/or achieve the same advantages of the embodiments described herein. Therefore, the scope of protection of the present invention should be subject to the scope as defined in the appended claims.

The invention claimed is:

1. A mobile phone device, comprising:
a baseband processor;
an antenna for receive and send radio frequency signals; and
a radio frequency transceiver circuit connected to the baseband processor and the antenna, the radio frequency transceiver circuit comprising:
a power amplifier output configured to be connected to one of a first power amplifier or a second power amplifier in place of the first power amplifier, the first power amplifier and the second power amplifier having a first load impedance and a second load impedance, respectively, the first load impedance and the second load impedance being different than one another; and
an impedance adjusting device electrically connected between the power amplifier output and the antenna, wherein the impedance adjusting device includes a first switch and a second switch directly connected to the power amplifier output, and
wherein the baseband processor is connected to and is configured to adjust an impedance value of the impedance adjusting device by controlling a state of the switch and the second switch to selectively couple the power amplifier output to one of (i) a first impedance having a first impedance value when the first power amplifier is present such that the first load impedance of the first power amplifier matches an output impedance associated with the radio frequency transceiver circuit, and (ii) a second impedance having a second impedance value when the second power amplifier is present such that the second load impedance of the second power amplifier matches the output impedance associated with the radio frequency transceiver circuit.

2. The mobile phone device of claim 1, wherein the baseband processor is configured to control the state of the first switch and the second switch via a mobile industry processor interface.

3. An impedance adjusting device configured to impedance match a first power amplifier or a second power amplifier having a first load impedance and a second load impedance, respectively, to an output impedance, the first load impedance and the second load impedance being different than one another, the impedance adjusting device comprising:
a first switch directly connected to a power amplifier output; and
a second switch directly connected to the power amplifier output,
wherein the power amplifier output is connected to one of the first power amplifier or the second power amplifier in place of the first power amplifier, and
wherein the first switch and the second switch are configured to switch an impedance value of the impedance adjusting device according to control signals received from a baseband processor by selectively coupling the power amplifier output to (i) a first impedance having a first impedance value when the first power amplifier is present such that the first load impedance matches the output impedance, and (ii) a second impedance having a second impedance value when the second power amplifier is present such that the second load impedance matches the output impedance.

4. The mobile phone device of claim 1, wherein the first impedance and the second impedance each have a predetermined impedance value that is based upon the first load impedance of the first amplifier and the second load impedance of the second amplifier, respectively.

5. The mobile phone of claim 1, further comprising:
a duplexer coupled between the antenna and the impedance adjusting device.

6. The mobile phone of claim 5, wherein the output impedance associated with the radio frequency transceiver circuit includes an impedance of the duplexer.

7. The mobile phone device of claim 3, wherein the control signals received from a baseband processor are in accordance with a mobile industry baseband processor interface.

8. The mobile phone device of claim 3, wherein the first impedance and the second impedance each have a predetermined impedance value that is based upon the first load impedance of the first amplifier and the second load impedance of the second amplifier, respectively.

9. The mobile phone of claim 3, further comprising:
a duplexer coupled between the antenna and the impedance adjusting device.

10. The mobile phone of claim 9, wherein the output impedance includes an impedance of the duplexer.

* * * * *